United States Patent [19]

Roberts

[11] 3,920,495

[45] Nov. 18, 1975

[54] METHOD OF FORMING REFLECTIVE MEANS IN A LIGHT ACTIVATED SEMICONDUCTOR CONTROLLED RECTIFIER

[75] Inventor: John S. Roberts, Export, Pa.

[73] Assignee: Westinghouse Electric Corporation, Pittsburgh, Pa.

[22] Filed: Aug. 29, 1973

[21] Appl. No.: 392,698

Related U.S. Application Data

[63] Continuation-in-part of Ser. No. 248,451, April 28, 1972, abandoned.

[52] U.S. Cl. .................... 156/8; 156/17; 252/79.3; 357/19

[51] Int. Cl.$^2$ .................... H01L 7/00

[58] Field of Search ............ 156/3, 7, 8, 13, 15, 17; 252/79.3; 29/580, 583; 96/36; 317/234, 235; 65/31; 357/19

[56] References Cited

UNITED STATES PATENTS

| | | | |
|---|---|---|---|
| 3,088,888 | 5/1963 | Leff | 156/17 X |
| 3,107,188 | 10/1963 | Hancock | 156/17 |
| 3,290,192 | 12/1966 | Kelley | 156/17 |
| 3,499,805 | 3/1970 | Brooks | 156/13 |
| 3,621,565 | 11/1971 | Sandstrom et al. | 29/580 X |

*Primary Examiner*—William A. Powell
*Attorney, Agent, or Firm*—C. L. Menzemer

[57] ABSTRACT

This disclosure is concerned with a method of forming light reflective etch pits preferably having a tetrahedral pattern, in a surface, preferably a [111] surface, of a body of semiconductor material. The body of semiconductor material, preferably silicon, has two opposed major surfaces which are substantially parallel, the body is divided into four alternate regions of opposite type conductivity, the two end regions being emitter regions and the two middle regions being base regions when the body is employed as a light activated four region switch. Activating light enters at one major surface of the body, passes entirely through the body to the opposed major surface where light reflective etch pits cause the light to pass back through the body.

3 Claims, 2 Drawing Figures

METHOD OF FORMING REFLECTIVE MEANS IN A LIGHT ACTIVATED SEMICONDUCTOR CONTROLLED RECTIFIER

GOVERNMENT CONTRACT

This invention is the result of work performed under a contract with the U.S. Navy, to wit; N00039-71-C-0228.

CROSS-REFERENCE TO RELATED APPLICATIONS

This disclosure which is a continuation-in-part of application Ser. No. 248,451, filed Apr. 28, 1972, now abandoned, provides a means for forming the reflective means employed in the semiconductor device set forth and claimed in U.S. Pat. No. 3,590,344, issued June 29, 1971, the assignee of which is the same as that of the present application.

BACKGROUND OF THE INVENTION

Field of the Invention

This invention is in the field of preparation of semiconductor devices.

SUMMARY OF THE INVENTION

In accordance with the present invention there is provided a process for forming light reflecting etch pits in a preselected portion of a major surface of a body of semiconductor material comprising; masking preselected surface portions of a body of silicon with a material capable of withstanding hydrofluoric acid, immersing said body of silicon in 49% hydrofluoric acid to remove any oxides from the unmasked surface portion of the body, immersing said body in an etching solution for a preselected period of time while agitating the solution relative to said body, said etching solution having been prepared by forming a first solution by admixing 100 grams of chromium trioxide in 100 milliliters of water and just prior to etching adding 100 milliliters of 49% hydrofluoric acid to 100 milliliters of said first solution, and removing said body from said etching solution, quenching said body with deionized water and thereafter removing said masking material from said body.

DESCRIPTION OF THE DRAWINGS

For a better understanding of the nature of the invention, reference should be had to the following detailed description and drawing in which.

DESCRIPTION OF PREFERRED EMBODIMENTS

Figure 1:
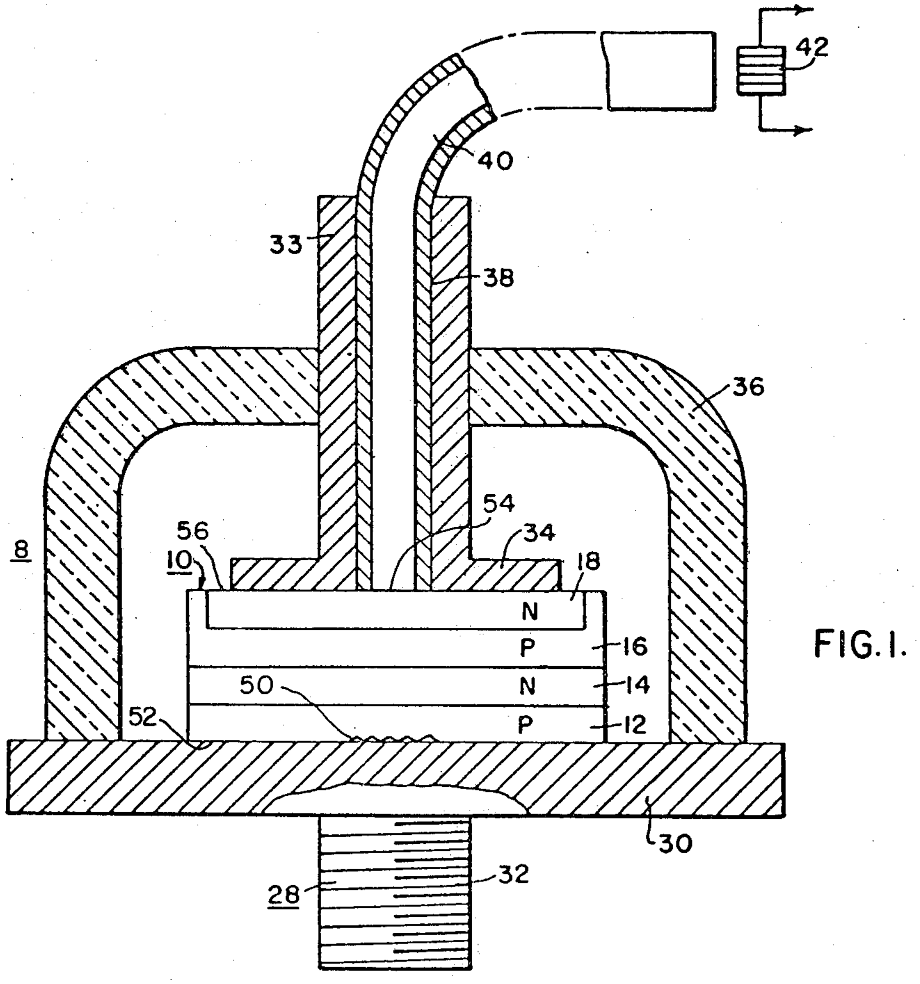
FIG. 1 is a side view of a light activated semiconductor device incorporating the teachings of this invention.

With reference to FIG. 1, there is shown a light activated, four region, semiconductor switching device 8 incorporating the teachings of this invention.

The device 8 is comprised of a body of silicon 10 having a P-type anode emitter region 12, an N-type base region 14, a P-type base region 16 and an N-type cathode emitter region 18. The device 8 includes two power terminals 28 and 33 adapted for connection to a source of electrical power, not shown. In the particular embodiment shown the lower terminal 28, preferably formed from copper or some other similar material of high electrical conductivity, has a flat portion 30 on which the lower anode emitter region 12 is bonded. Extending downwardly from the flat portion 30 is a threaded stud portion 32 adapted for connection to a heat sink or the like.

It should be understood of course, that the teachings of this invention are equally applicable to flat package type devices and that the device 8 is shown only for purposes of explaining the invention.

The upper terminal 33 comprises an elongated column, also of copper or some other material of high electrical conductivity, and has a lower flattened portion 34 which rests on the upper surface of the body 10 and is bonded to the cathode emitter region 18. Surrounding the body 10 and hermetically sealed to the terminals 28 and 33 is a cup-shaped ceramic insulator 36. Instead of a conventional gate lead, this type of device has an internal bore member disposed in the upper power terminal 33; and the upper end of the bore 38 is connected through a light pipe 40, preferably butted against the surface of the cathode emitter 18, to a source of light energy, typically a gallium arsenide laser diode, or laser diode stack 42.

There is a reflective means 50 on surface 52 of the body 10 directly below area 54 on surface 56 of wafer 10.

The reflective means 50 is a series of grooves formed in surface 50 of body 10. The reflection means 50 in conjunction with radiation from laser diode 42 which radiation is conducted through light pipe 40 directly onto unmetallized area 54 "turns on" the device. The radiation strikes the reflective means, grooves 50, and is reflected into the area of body 10 shielded from the direct radiation by portion 34 of power terminal 33. The remote area of the device is thus activated without waiting for lateral spreading from the activated regions to occur.

Figure 2:
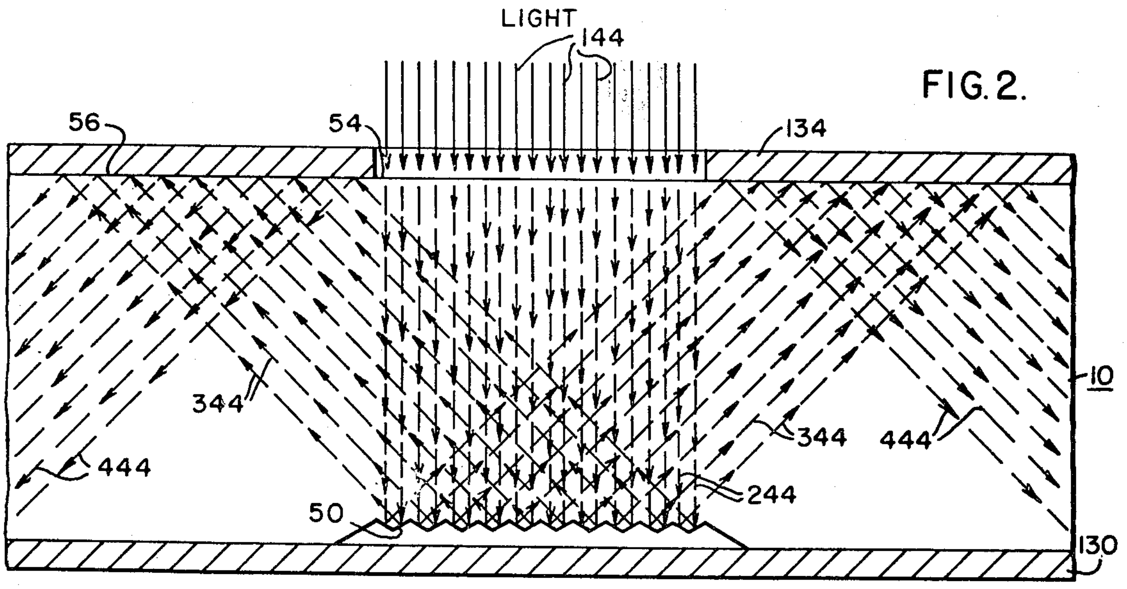
FIG. 2 is a side view of the body 10 of semiconductor material employed in the device of FIG. 1.

With reference to FIG. 2, there is shown a greatly enlarged view of the body 10 of semiconductor material of FIG. 1. The body 10 is shown in FIG. 2 with aluminum electrical contacts 130 and 134 affixed thereto.

As shown in FIG. 2, light energy indicated by arrows 144 strikes area 54 on surface 56 of body 10. The light being of an intensity and wavelength such that at least a portion of it will completely penetrate the body 10, passes through the body 10 from surface 56 to surface 52, indicated by arrows 244, where it strikes grooves 50, and is reflected at an angle back toward surface 56 indicated by arrows 344. Because of the angle of the grooves 50, the light is reflected toward that portion of surface 56 covered by contact 134. When the light strikes the surface 56 it is again reflected back toward surface 52, indicated by arrows 444. Thus, the entire body 10 is essentially simultaneously completely activated, completely turned-on by the light without any delay while lateral current flow takes place.

The proper operation of a device made in accordance with the teachings of this invention is dependent upon selecting a radiation or light source of sufficient intensity and having the proper wavelength and forming grooves at the proper angle from the horizontal to ensure the desired reflection.

One satisfactory radiation or light source for use with a device of this invention is a neodymium doped rod laser. Suitable rod lasers are glass lasers, yttrium-aluminum-garnet lasers and calcium-fluorophosphate lasers.

The radiation from a neodymium doped rod laser has a wavelength of about 106μ. The characteristic absorption depth of this radiation in silicon is between 300 and 500 microns. Consequently, the radiation from a neodymium doped laser is attenuated by 67% passing through a thickness of from 300 to 500 microns of silicon. Power semiconductor devices are comprised of a body of silicon which typically vary in thickness from 125 microns to 375 microns. Thus it is obvious, given a beam with sufficient energy, the radiation can pass through a body thickness several times and still generate in each pass a sufficient number of hole-electron pairs to actuate essentially all of the body.

In choosing the angle of the reflecting concentric grooves shown in FIGS. 1 and 2 several factors must be considered. First, one has the choice of making the grooves and the surfaces beneath the electrical contacts highly reflective by polishing and metallic deposition, or an angle can be chosen such that the critical angle for the semiconductor is exceeded for the radiation wavelength used. The refractive index for silicon for wavelengths in spectrum suitable for use is about 3.5. Thus the critical angle is about 16.5° to 17°. Any time the radiation is incident on a silicon surface from within the crystal at an angle greater than 17° to the normal of the surface, the radiation will be totally reflected.

The reflection grooves 50, which are preferably of the tetrahedral pattern, can be formed with the desired angle in [111] surfaces of a silicon body by a particular chemical etching technique.

In preparing a body of silicon in accordance with the teachings of this invention the desired p and n regions are formed in the body by diffusion, epitaxial growth or a combination of epitaxial growth and diffusion.

The body is then ready for the forming of the light reflecting etch pits in a preselected surface portion. The etch pits formed are of a tetrahedral pattern.

The body is cleaned by immersion in a suitable solvent, as for example, acetone, and then rinsed in deionized, distilled water.

All surfaces of the body, except that portion in which the reflection grooves are to be formed, is masked with a suitable material, as for example, apiezon wax, which is resistant to hydrofluoric acid.

The body is then immersed in hydrofluoric acid for a few seconds to remove any oxides from the surface portion to be etched. Preferably, 49% hydrofluoric acid is used for this operation.

The etchant solution is prepared by forming a first solution by dissolving 100 grams of chromium trioxide in 100 milliliters of distilled water and immediately before carrying out the etching operation 100 milliliters of 49% hydrofluoric acid is added to 100 milliliters of the first solution. The presence of hydrofluoric acid causes the etching solution to deteriorate and therefore it is critical that the 49% hydrofluoric acid be added just before etching is to take place.

The body is then immersed in the etching solution for a period of time ranging from 5 to 10 minutes, preferably 7 minutes. The etching solution is agitated relative to the body. A sloped rotating table assembly has been found satisfactory for agitation.

After etching the body is removed from the etchant solution, quenched in deionized water and the masking matetial removed using a suitable solvent.

The body is now ready for affixing of contacts and encapsulation as shown in FIG. 1.

I claim as my invention:

1. A process for forming light radiation reflecting tetrahedral etch pits in a preselected surface portion of a body of silicon comprising; masking preselected surface portions of a body of silicon with a material capable of withstanding hydrofluoric acid, immersing said body of silicon in hydrofluoric acid to remove any oxides from the unmasked surface portion of the body, immersing said body in an etching solution for a preselected period of time while agitating the solution relative to said body, whereby, tetrahedral etch pits are formed in the unmasked surface portion of the body, said etching solution having been prepared by forming a first solution by admixing 100 grams of chromium trioxide in 100 milliliters of water, and just prior to etching adding 100 milliliters of 49% hydrofluoric acid to 100 milliliters of said first solution, and removing said body from said etching solution, quenching said body with deionized water and thereafter removing said masking material from said body.

2. The process of claim 1 in which the preselected time ranges from 5 to 10 minutes.

3. The process of claim 1 in which the preselected time is 7 minutes.

* * * * *